United States Patent [19]

Thielman et al.

[11] Patent Number: 5,069,041

[45] Date of Patent: Dec. 3, 1991

[54] METHOD AND APPARATUS FOR ELECTROMECHANICAL AIR CONDITIONING OF INDUSTRIAL ELECTRONICS

[75] Inventors: David E. Thielman, Hennepin County; Dennis E. Welch, Anoka County; Theodore P. Bezat, Hennepin County, all of Minn.

[73] Assignee: McLean Midwest Corporation, Brooklyn Park, Minn.

[21] Appl. No.: 552,989

[22] Filed: Jul. 16, 1990

[51] Int. Cl.⁵ .............................................. A25D 23/12
[52] U.S. Cl. .......................................... 62/263; 62/97
[58] Field of Search ............................ 62/263, 262, 97

[56] References Cited

U.S. PATENT DOCUMENTS

| | | | |
|---|---|---|---|
| 3,831,395 | 8/1974 | Levy | 62/263 |
| 3,938,348 | 2/1976 | Rickert | 62/262 X |
| 4,048,811 | 9/1977 | Ito et al. | 62/263 |
| 4,592,413 | 6/1986 | Sugita et al. | 62/263 X |
| 4,835,981 | 6/1989 | Rinholen | 62/262 X |

Primary Examiner—Lloyd L. King
Attorney, Agent, or Firm—Henry C. Kovar

[57] ABSTRACT

An industrial electronics air conditioner has a cabinet with top, bottom, side and end panels, an electromechanical refrigeration system within the cabinet, an easily removable elongate condenser blower and motor module which comes out and goes in transversely when a side panel is removed, an easily removable evaporator blower and motor module having a centrifugal blower wheel and manual latches for retention to and removal from an end panel, a unique improved structure of intersecting interior barriers defining air outlet plenums and crossing hot ambient and cooled load outlets, and unique corrugated plastic exhaust ducting for exhausting hot ambient air to the outside of an electronics enclosure. A method of installing the air conditioner within the enclosure is also provided. The method and structure are particularly well suited for internal rack mounting in a wide variety of closed electronic enclosures having a wide variety of internal electronics for control of automation, factories, control systems, computation, logic and other industrial heat loads.

46 Claims, 6 Drawing Sheets

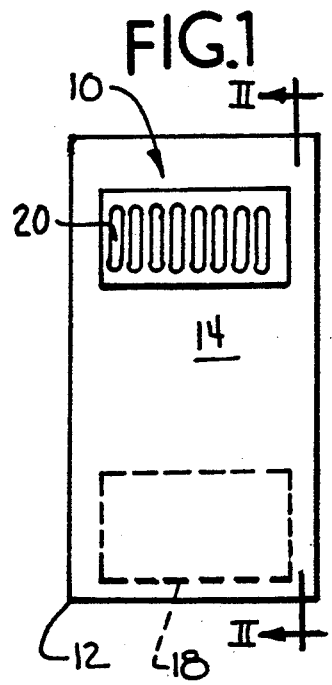
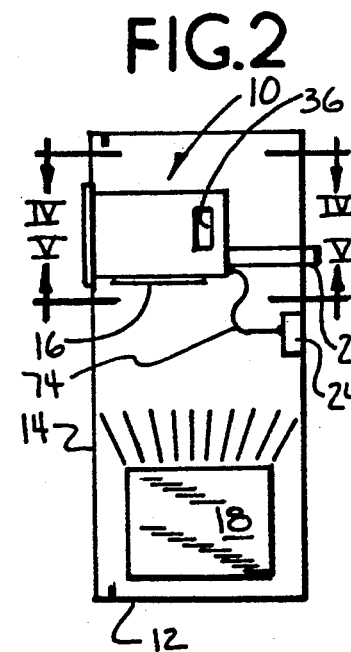
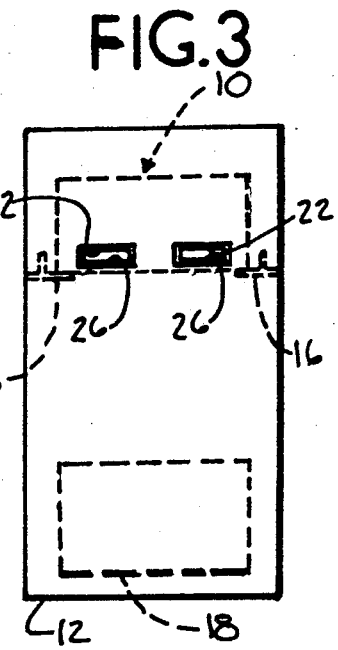
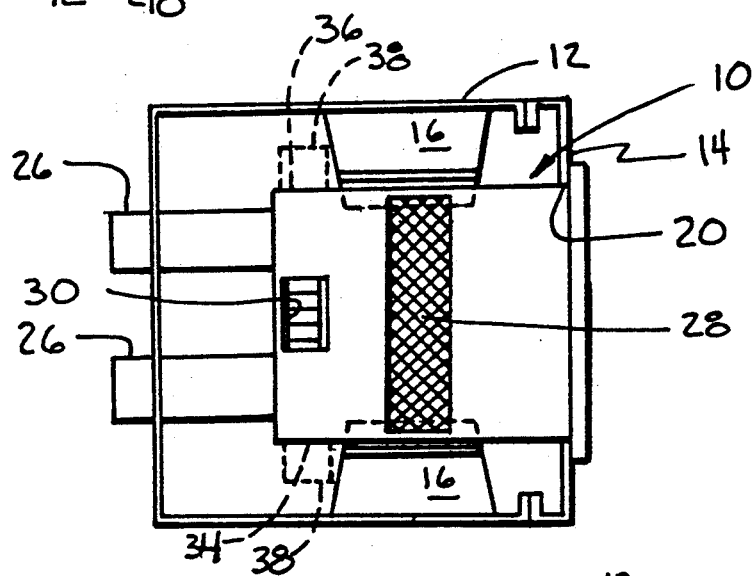
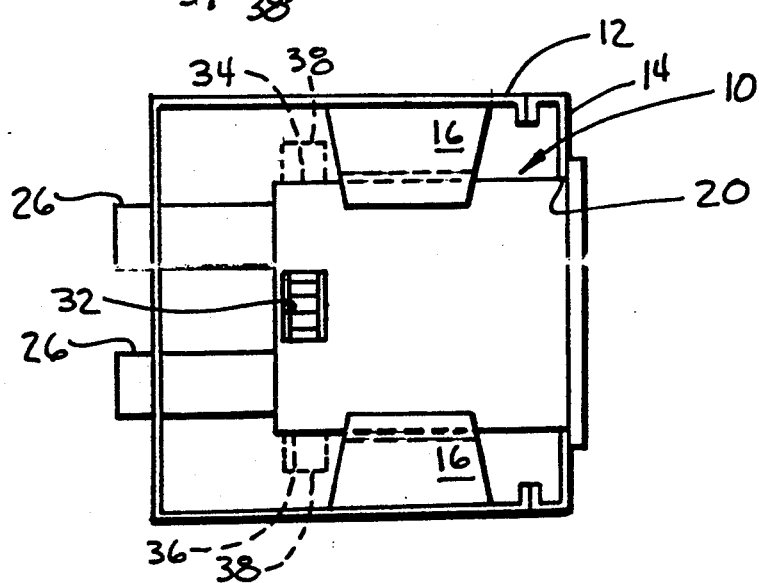

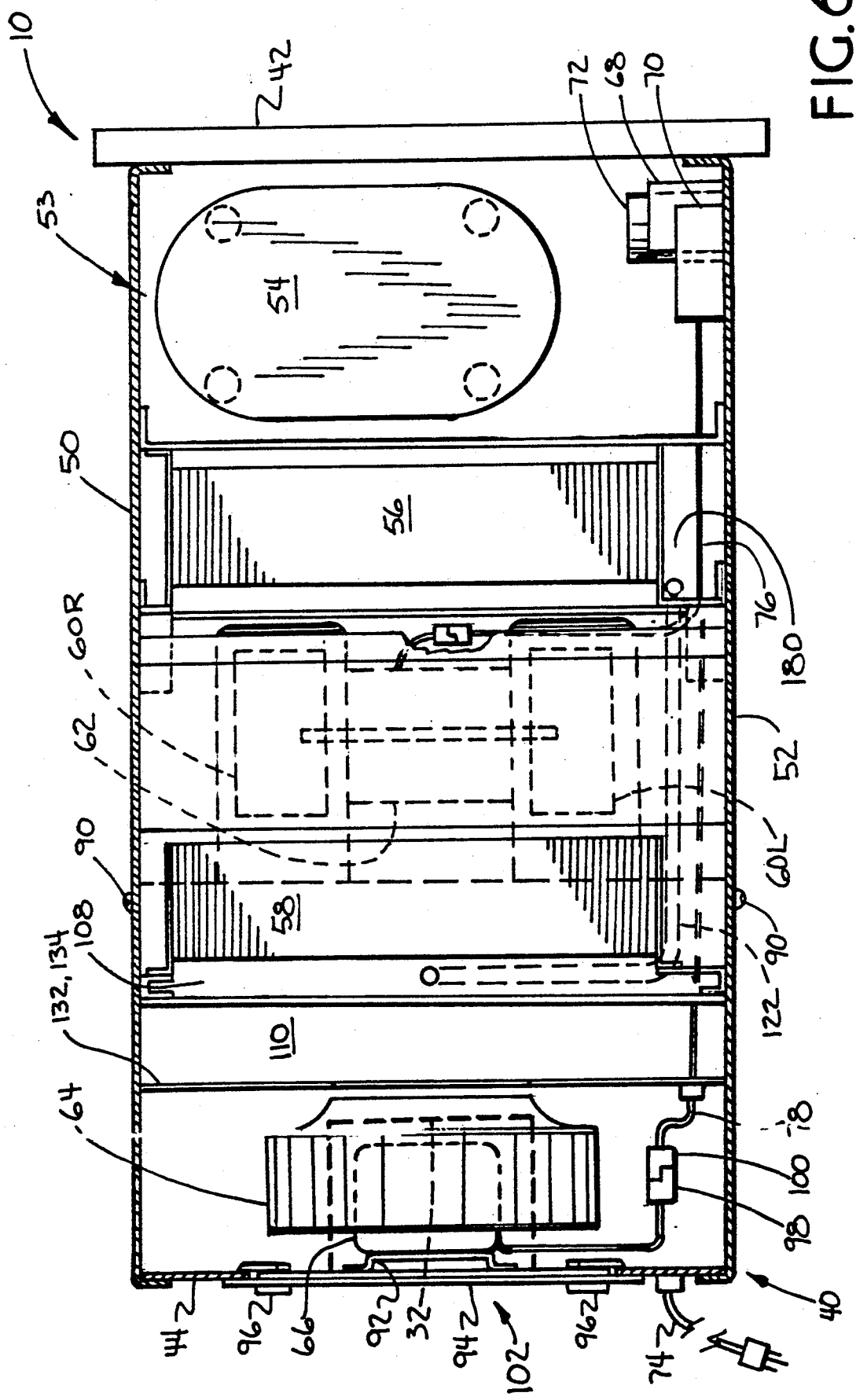

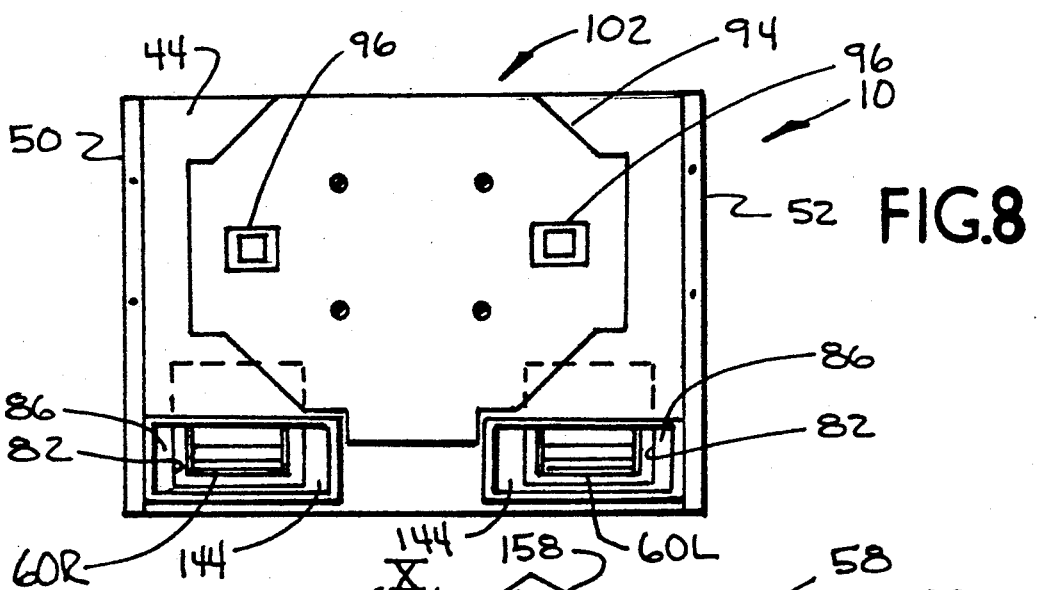
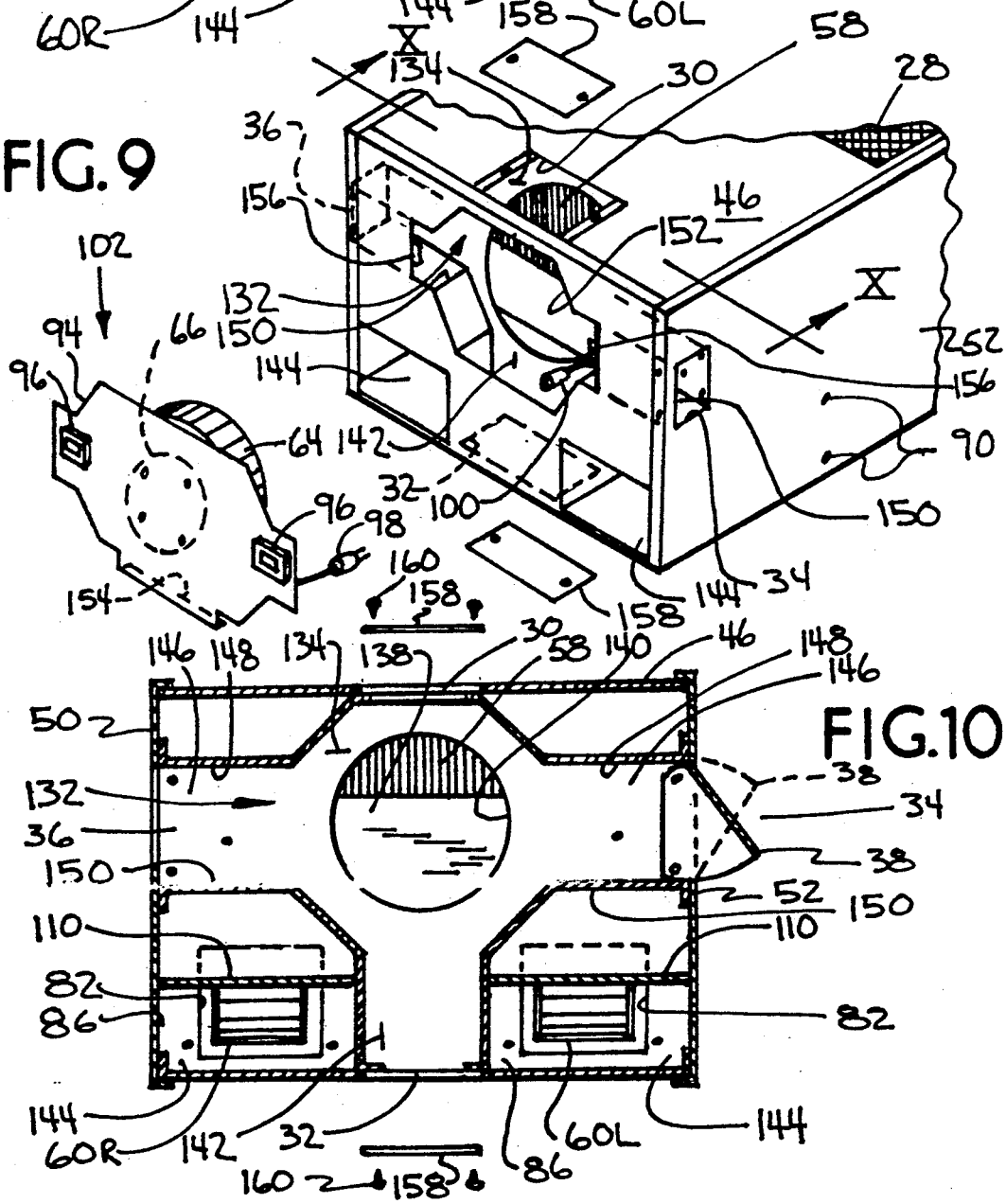

METHOD AND APPARATUS FOR ELECTROMECHANICAL AIR CONDITIONING OF INDUSTRIAL ELECTRONICS

BACKGROUND OF THE INVENTION

1. Field of the Invention

This invention pertains to a method and apparatus for cooling of electrical equipment with electromechanical refrigeration and forced air cooling.

2. The Prior Art

There are several commercially available electromechanically refrigerated cooling machines for cooling electronic enclosures and electronic equipment. Such machines have been continually used from about 1970 to date.

The particular cooling machine being discussed is generically referred to in the industrial community as a "rack mount" air conditioner or climate controller. Applicant McLean Midwest Corporation has been in this business for several years and presently offers a product line comprising Models HB11 and HB16 in 2, 3, 4, 5, 6, & 7000 BTU/hour outputs for rack mounting inside a cabinet near the top. McLean also offers its Models LB11, LB12, and LB14 and LB16 in 2, 3, 4, 5, 6, & 7000 BTU/hour outputs for rack mounting inside a cabinet near the bottom. McLean has amongst these models and outputs three (3) entirely different basic designs and seventeen (17) specific models which then further divides into voltages and so forth. It will be apparent that one of the significant problems with this type of device is the multiplicity of devices required in order to satisfy the needs for various physical configurations and directing of the cooling effort up, down, and/or transversely.

The existing devices do not, by today's improved standards and increased expectations of excellence provide sufficient thermal separation of the heated and the cooled air streams and there is a disadvantageous loss of thermal efficiency due to unwanted heat transfer.

Serviceability has become a problem because it has become apparent that both the condenser blower motor and the evaporator blower motor will fail and need replacement at least once during the life of the device. If replacement of these blower motors is difficult, the entire unit will be prematurely scrapped.

It has also been found that greater volume flows of cooled air are desirable, and that the device must fit in and to an ever increasing variety of cabinets and enclosures. It has also been found that more powerful condenser blowers are required in this type of device to meet ever more stringent ambient temperature conditions.

Much of the foregoing is influenced by the conversion from R-12 to R-22 refrigerant, for environmental benefit.

OBJECTS OF THE INVENTION

It is an object of this invention to provide a new and improved industrial air conditioner or climate controller for an electrical enclosure.

It is an object of this invention to provide a single climate controller which will replace a plurality of other rack mount industrial climate controllers.

It is an object of this invention to provide a new and improved climate controller having multiple configuration cooled air outlets.

It is an object of this invention to provide a new and improved climate controller having structure for economically viable replacement of the condenser blower motor and/or the evaporator blower motor.

It is an object of this invention to provide a new and improved climate controller having better thermal separation of the heated and cooled air flows.

It is an object of this invention to provide a new and improved single embodiment of climate controller that will rack mount into a variety of electronic and/or electrical cabinets, in either top, bottom, at any height, or in transverse positions; the cabinets maybe of significant variation in height, width, and/or depth.

It is an object of this invention to provide a new and improved rack mount climate controller that will efficiently fit in any depth electrical/electronic enclosures.

It is an object of this invention to provide a new method of installing a rack mount climate controller into a closed cabinet.

It is an object of this invention to provide a new and improved method and structure for exhausting hot ambient air from an industrial electronics air conditioner and for delivering cooled load air to an industrial electronics enclosure from a single cooling apparatus.

SUMMARY OF THE INVENTION

An industrial electronics air conditioner has a cabinet, an electromechanical refrigeration system, an ambient air inlet and outlet, a load air inlet, and a new load air outlet structure for selectively directing cooled air up, down and/or sideways.

An industrial electronics air conditioner has a cabinet, an electromechanical refrigeration system, and a transversely elongate condenser blower mount which together with a condenser blower and motor is easily transversely removed and reinstallable when a side panel is removed from the conditioner.

An industrial electronics air conditioner has a cabinet, an electromechanical refrigeration system, a condenser blower module having a spaced apart pair of centrifugal blowers, a pair of spaced apart hot air outlets generally aligned with the blowers, an evaporator blower and motor, and a cooled air outlet in between the hot air outlets.

An industrial electronics air conditioner has a cabinet, an electromechanical refrigeration system, a cooled air outlet plenum, a plurality of spaced apart cooled air outlets from the plenum, an internal evaporator blower motor electrical connector, and a cooled air blower module having a plenum cover, motor and blower wheel, connector plugs, locating and positioning structure, and manual latches for easy securement or release of the module.

An industrial electronics air conditioner has a cabinet, an electromechanical refrigeration system, an ambient inlet in one end, a load air inlet and a load air outlet, at least one hot air outlet, and elongate exhaust ducting fluidly connected to the hot air outlet.

An industrial electronics air conditioner has a cabinet, an electromechanical refrigeration system, an ambient air inlet and a load air inlet, and first, second and third barriers dividing the inside of the cabinet into a new structure of crossed hot and cooled air outlets.

An air conditioned electronic control center has an electronics enclosure containing a heat load, an electromechanical air conditioner in the enclosure, and elongate hot air exhaust ducting extending from the conditioner to the outside of the enclosure.

A method of installing an air conditioner into an electronics enclosure has the steps of providing a first aperture through the enclosure for flow of ambient air into the conditioner, installing the conditioner inside the enclosure, extending exhaust ducting through the enclosure to the conditioner, sealing the ducting to a hot ambient air outlet of the conditioner, and trimming the ducting to length.

Other problems of the prior art, objectives and advantages of this invention and further aspects of the invention will become apparent to those skilled in the art upon learning and use of the teachings herein.

BRIEF DESCRIPTION OF THE DRAWINGS

FIG. 1 is front elevational view of the preferred embodiment of the air conditioner of the present invention, installed in an electrical or electronic enclosure cabinet;

FIG. 2 is a sectional side elevational view through lines II—II;

FIG. 3 is a back elevational view of FIG. 1;

FIG. 4 is a sectional downward looking view through lines IV—IV;

FIG. 5 is a sectional upward looking view through lines V—V;

FIG. 6 is a top plan view in section of the air conditioner of FIG. 1, with the top panel being removed;

FIG. 8 is an elevational view of the back of the air conditioner of FIG. 6;

FIG. 9 is a perspective view of the back of the air conditioner of FIG. 6, with the evaporator blower and motor removed;

FIG. 10 is an elevational view in section, of the evaporator outlet ducts as taken through lines X—X;

DESCRIPTION OF THE PREFERRED EMBODIMENT

Figure 7:
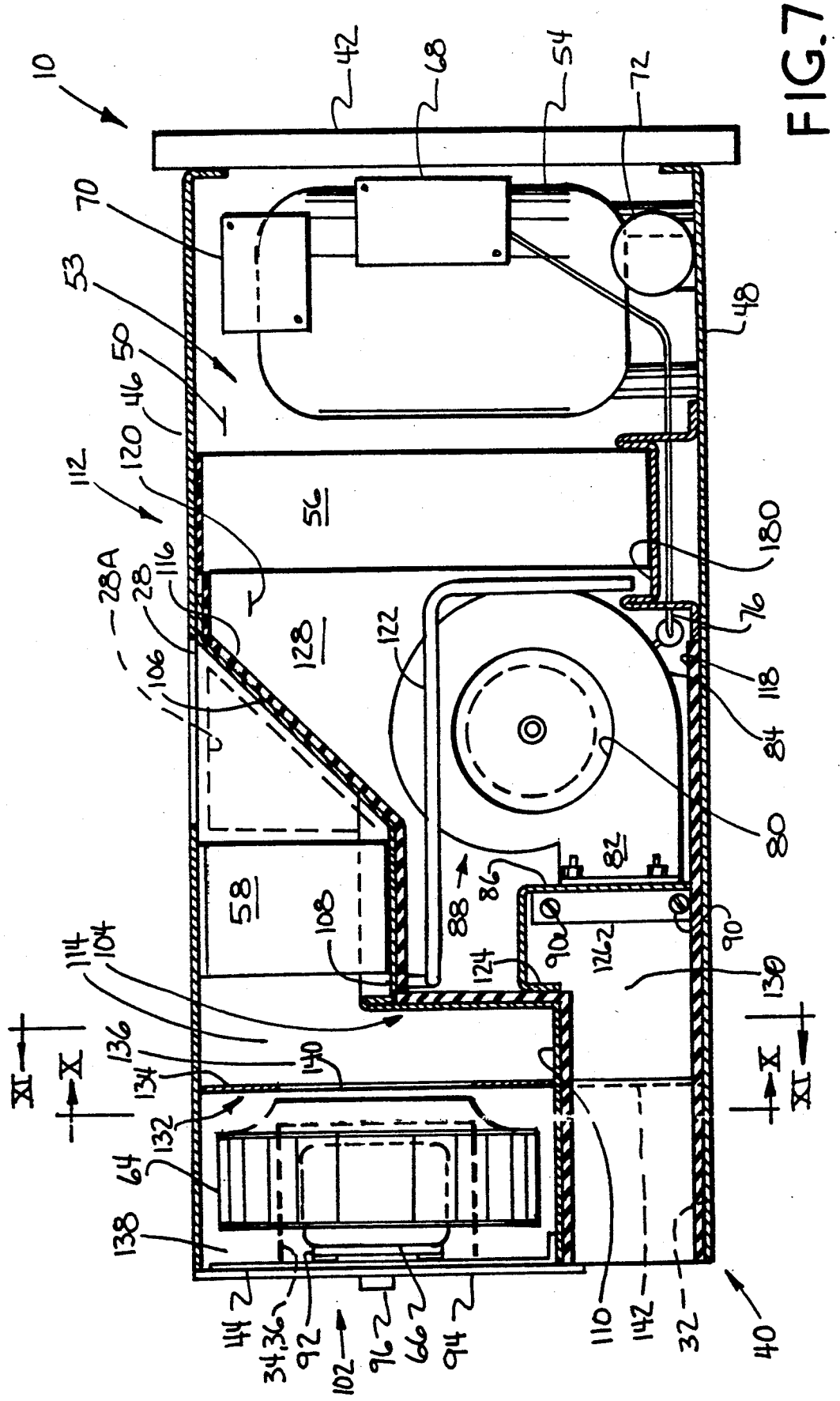
FIG. 7 is a side elevational view in section of the air conditioner of FIG. 6, with near side panel removed.

In accordance with the principles of this present invention an industrial electronic air conditioner is provided as shown in FIGS. 1-11 and as generally indicated by the numeral 10.

The conditioner 10 is mounted inside of a sealed and closed electronics enclosure 12 as best shown in FIGS. 1-5, which usually is a large metal box housing an operable front door 14. The conditioner 10 is commonly referred to as being of the "rack-mount" type and is typically mounted directly upon a support rack 16 inside of the enclosure 12. Within the enclosure 12 is a significant heat load 18 comprising electrical and electronic controls, relays, transformers, printed circuit boards, and the like for control of larger machines and systems such as machine tools, robots, heating, lighting, assembly lines, process lines, factories, computational machines and the like. The enclosure 12 has a first inlet aperture 20 for supply of ambient air into the conditioner 10, and at least one hot air exit outlet aperture 22 for the exhaust of heated ambient air from the conditioner 10. Within the enclosure 12 is a power source 24 for the conditioner 10. As is shown the conditioner 10 has at least one elongate exhaust duct 26 fluidly connecting the conditioner 10 to outside of the enclosure 12. The ambient air inlet aperture 20 is on an upright side of the enclosure 12 and the ambient air outlet aperture 22 is on a different side to direct the heated exhaust of ambient air away from the intake aperture 20. As shown the exhaust duct(s) 26 are exactly opposite to the intake aperture 20 but it is also possible to direct the exhaust duct(s) 26 upward out the top of the enclosure 12.

The enclosure 12 maybe of a variety of sizes, shapes, and configurations. The heat load 18 may likewise be of a variety of sizes, shapes, intensities, of varying location within the enclosure 12 and so forth. Every enclosure 12 and heat load 18 combination will be more or less unique and the conditioner 10 has new and unique structure for cooling the air within the enclosure 12 and thereby the heat load 18. Firstly the conditioner 10 maybe mounted anywhere within the enclosure 12. The exhaust duct(s) 26 can be arranged as needed to dispose of the hot air waste product. The conditioner 10 has an upward facing load air inlet 28 for intake of the warmest air inside the enclosure 12 from adjacent the top of the enclosure 12.

One of the important structures and functions of the conditioner 10 is a cooled air outlet structure that has a top load air outlet 30, a bottom load air outlet 32, and a pair of side load air outlets 34, 36.

Each of the side outlets 34, 36 has a director door 38 that can be angled up to direct side outlet 34, 36 cool air flow upward, that can be angled down to direct side outlet 34, 36 cool air flow downward, or which can be closed to concentrate cool air flow out of the other outlets 30, 32. The doors 38 can also be removed to give transverse cool air flow. These outlets 30, 32, 34, 36 can be selectively opened, closed, or adjusted to provide cool air flow exactly where it is needed and wanted for a wide variety of heat loads 18. Structure for selective closing of either or both of the top and bottom load air outlets 30, 32 is also provided as will subsequently be explained.

FIGS. 6, 7 and 8 show the structure of the conditioner 10 per se. The conditioner 10 has an exterior cabinet 40 that has an exterior inlet end panel 42 which will usually include an air filter and a grill, an interior air outlet end panel 44, a top panel 46, a bottom panel 48, and right and left side panels 50, 52. The outlet end panel 44 & bottom panel 48 are integrated into a single piece of sheet metal; the other panels 42, 46, 50, 52 are singular and are removable. Within the cabinet 40 is a complete operative electromechanical refrigeration system 53 comprising a compressor 54, a refrigerant-to-air evaporator 58, a condenser blower 60 and condenser blower motor 62, and air evaporator blower 64 and an evaporator blower motor 66. All of the conditioner electrical components, including the on-off control 68, safety control 70 and start/run capacitor 72, as well as the service cord 74 and fan motor leads 76, 78 are all secured and/or are adjacent to one of the side panels 50, 52 and in the illustration of FIG. 6 to the left side panel 52. The opposite side panel 50 has no electrical componentry.

As best shown in FIG. 6, the preferred condenser blower 60 is a pair of spaced apart centrifugal blowers 60L, 60R having a single central motor 62. The blowers 60L, 60R each have an outside facing inlet 80 and parallel co-planar outlets 82 in individual and spaced apart fan shrouds 84. The shrouds 84 are both secured to an elongate and full width blower mount 86. The blowers 60, motor 62, shrouds 84 and mount 86 form a condenser blower module 88 which is secured to the side panels 50, 52 only by three removable blower module fasteners 90.

As best shown in FIGS. 6, 7, 8 and 9, the preferred evaporator blower 64 is a backward inclined centrifugal blower wheel, a specific example of which is EBM brand and part number R2E 190-50-29. The blower 64 and motor 66 are secured to a motor mount 92 which in turn is secured to a cold air plenum cover 94. The plenum cover 94 has at least one and preferable a pair of manually operable spring loaded mono-stable latches 96; a specific example of which is SOUTHCO brand and part number A3-40-625-12. The evaporator fan motor leas 78 has a connector plug 98 and socket 100 nearby the evaporator blower motor 66. A completely independent and removable evaporator blower and motor module 102 is formed by the evaporator blower wheel 64, motor 66, bracket 92, cover 94, plug 98 and latches 96. As used herein the term "blower" 60, 64 is inclusive of any and all air moving structures such as wheels and fans driveable by an electric motor.

Within the cabinet 40 is a unique new baffle structure for dividing, directing and thermally separating distinct and separate flows of ambient and load air. A first baffle barrier 104 extends fore and aft as well as up and down and lies generally at an angle extending from the lower rear to an upper midpoint of conditioner and transversely across the entire interior width of the conditioner 10. The first barrier 104 is fluidly imperforate and has a inlet section 106 under the load air inlet 28, an integral condensate collector tray 108 under the evaporator 58, and a plenum barrier section 110 extending to the cabinet outlet end 44. That portion of the cabinet 40 interior volume upstream of and below the first barrier 104 is the high-side or hot air zone 112, and that portion of the cabinet 40 interior volume downstream of and above the first barrier 104 is the low-side or load air cooling zone 114. The entire underside of the first barrier 104 is covered by a layer of foam thermal insulation 116 and the upper surface of the bottom panel 48 downstream of the condenser 56 likewise has similar insulation 118. That portion of side panels 50, 52 which is downstream of the condenser 56 also have similar thermal insulation 120. A condensate drain tube 122 extends from the collection tray 108 to a condensate evaporator pan 180 under the condenser 56 for evaporation of condensate from the evaporator 58. The condenser blower mount 86 has flanges 124, 126 which engage and seal against the insulation 116, 118 respectfully. The condenser blower mount 86 also now doubles in function as a second barrier which divides the hot zone 112 into a suction side 128 to the right as seen in FIG. 7, and into a hot air outlet plenum 130.

A third barrier 132 within the cabinet 40 is generally upright and has an upper section 134 positioned between the outlet end 44 and the first barrier 104. The upper section 134 divides the cooling zone 114 into a suction side 136 and a cooled air outlet plenum 138. The upper section 134 has an aperture 140 enabling the evaporator blower 64 to draw air from the evaporator 58. The third barrier 132 has a lower section 142 which crosses and extends through the first barrier 104 to the bottom cooled air outlet 32. The lower section 142 of the third barrier 132 splits and divides the hot air outlet plenum 130 into a pair of spaced apart hot air outlets 144 which are located in each lower outer corner of the outlet end 44. The hot air outlets 144 are spaced transversely from each other and straddle the bottom cooled air outlet 32. In the volume between the third barrier 132 and the parallel outlet end 44, is the cooled air outlet plenum 138 which is connected to the cooled air outlets 30, 32, 24, 36 by a generally cross-shaped pattern of cold air outlet ducts 146 formed by an upper baffle 148 and a lower baffle 150.

At the back of the cooled air plenum 138 is a plenum aperture 152 sized to accept the evaporator blower 64, but which is smaller than the cover 94. The cover 94 has a pilot nose 154 sized and positioned to mate and register with the aperture 152 to locate and position the evaporator blower module 102 to the remainder of the conditioner 10. The aperture 152 has a pair of lock ears 156 to engage the latches 96. A pair of optional covers 158 are held by fasteners 160 to selectively close the top and/or bottom outlets 30, 32.

Figure 13:
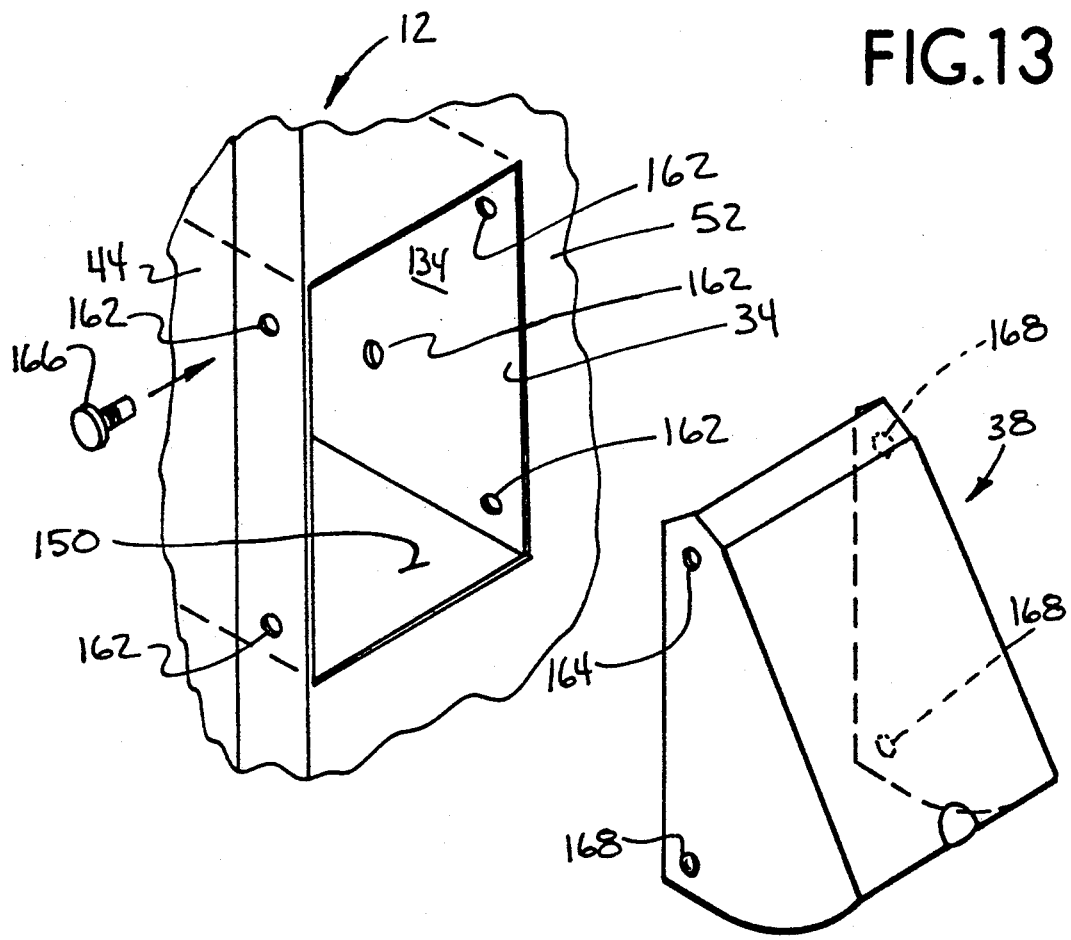
FIG. 13 is a perspective view of one of the side cooled air outlets, the other side being the mirror image of the side shown.

The side outlet doors 38 are shown best in FIGS. 9 and 13. The cabinet 40 and third barrier 132 are provided with a plurality of door holding apertures 162. Each door 38 is provided with a pivot journal 164 which is secured by a pivot pin 166 mountable in either the upper or lower door aperture 162 enabling each door 38 to be mounted either upwardly or downwardly, or to be closed or to be completely removed; there are four (4) different variants possible on each side cold air outlet 34, 36. Each door 38 has three (3) detent bumps 168 for suspension and positional fixing of each door 38. Each door 38 can then be selectively installed and set to best direct cool air for optimally cooling the heat load 18.

Figure 11:
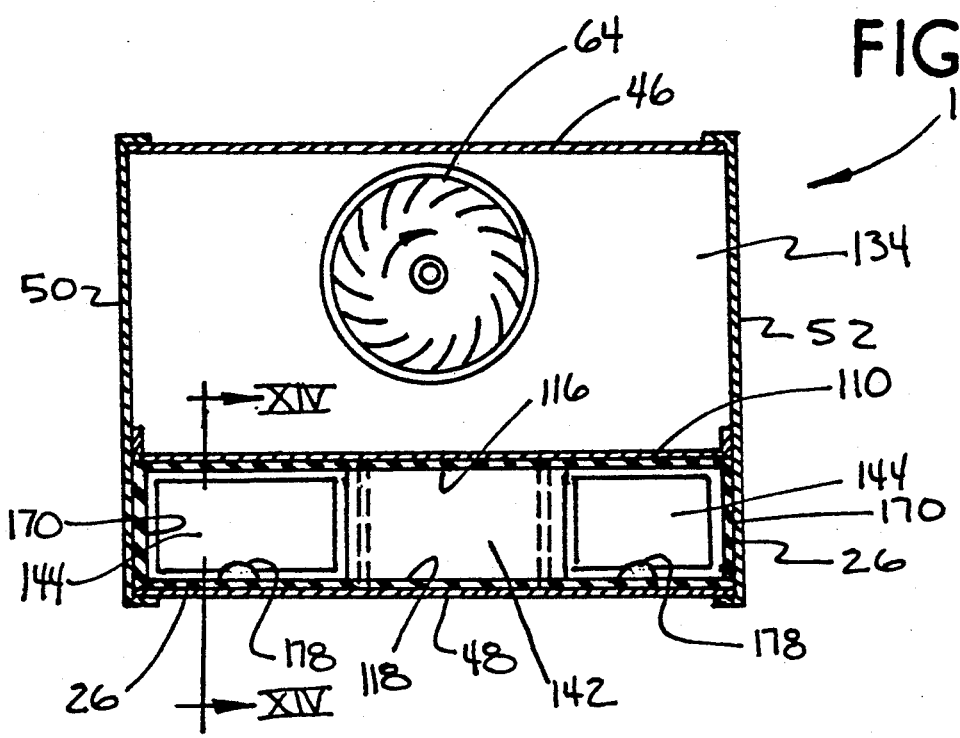
FIG. 11 is an elevational view in section of the air plenums, taken through lines XI—XI of FIG. 7.
Figure 12:
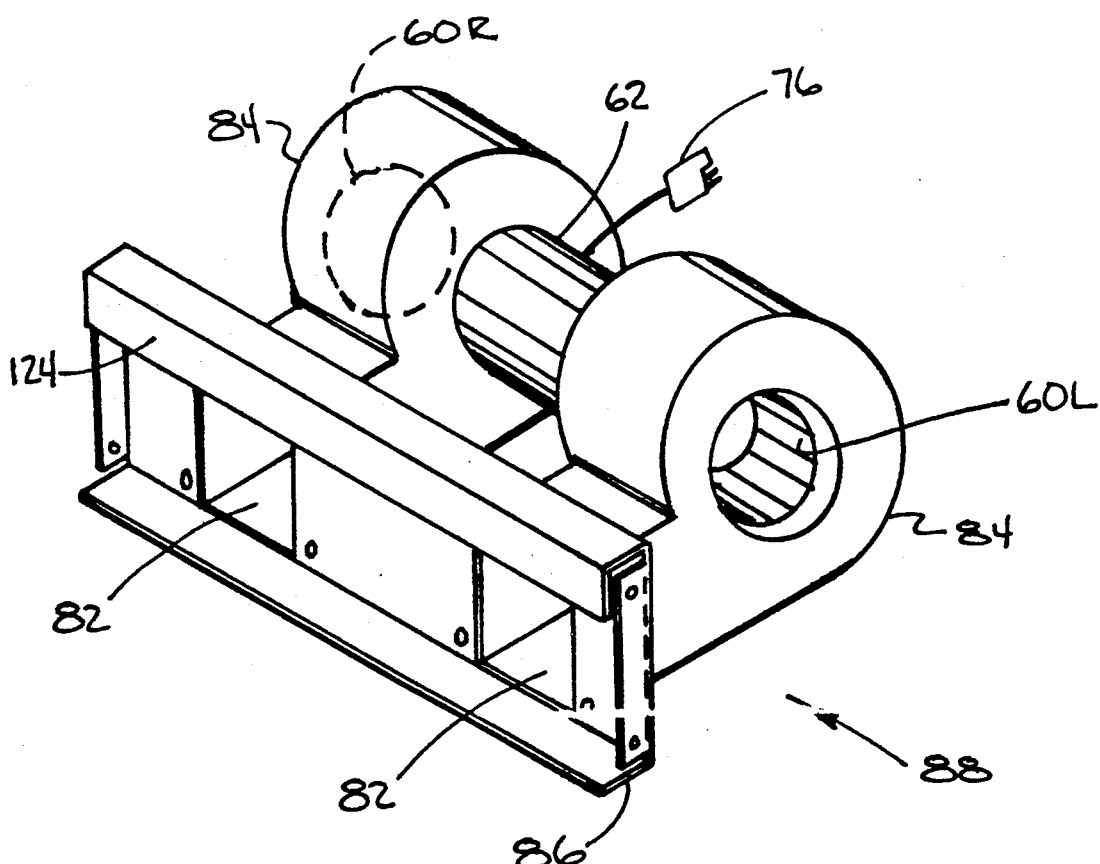
FIG. 12 is a perspective view of the condenser blower assembly shown in FIGS. 6 and 7.
Figure 14:
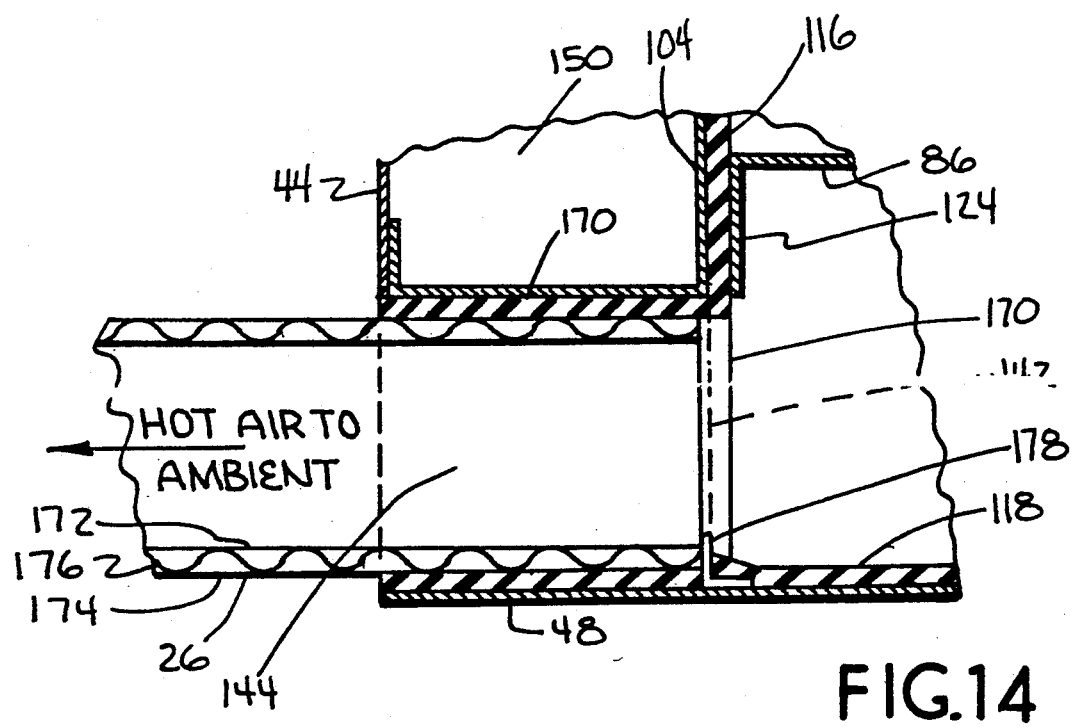
FIG. 14 is an elevational section of the condenser air outlet, taken through lines XIV—XIV of FIG. 11.

FIGS. 11 & 14 best show the hot air outlets 144 and exhaust ducts 26. The entire hot air outlet 144 is lined by the insulation 116, 118, and by further insulation 170 on lower section 142. Each of the exhaust ducts 26 is preferably of rectangular cross section and devised of corrugated plastic board which is completely plastic and has an inner layer 172, an outer layer 174 and an inner corrugation 176. This new exhaust duct 26 provides resistance to condensation, corrosion and thermal loss. The plastic exhaust ducts 26 are also very easy to trim to lengths and can be shipped flat for subsequent framing and assembly on-site. Each outlet 144 has an exhaust duct stop 178 to properly position the duct 26 in the exhaust outlet 144.

Note that alternative load air inlets 28A as shown in FIG. 7, can be provided adjacent the top panel 46 but above the first barrier 104 and through the top of the side panels 50, 52.

In the installation of the conditioner 10, cold air outlets 30, 32, 34, 36 all come normally closed and require selective opening, or may come all open and require selective closing. The enclosure 12 is provided with the appropriate apertures 20, 22 and the conditioner 10 is slid into the enclosure 12 and placed upon the support rack 16. The exhaust duct(s) 26 are then pushed in and sealed to the outlet ducts 144 by friction against the insulation 116, 118, 170. The outer ends of the ducts 26 are then trimmed to an appropriate length. The enclosure 12 and conditioner 10 are then ready to operate. The cold air outlets 30, 32, 34, 36 are adjusted to optimize cooling of the particular heat load 18 based on where in the enclosure 12 the conditioner 10 is mounted.

During the useful life of the electronic heat load componentry 18 and the conditioner 10, it is anticipated that the condenser blower motor 62 and the evaporator blower motor 66 will each fail at least once; even if these motors 62, 66 are of the highest available quality. To replace the condenser blower motor 62 or condenser blower module 88, the fasteners 90 are removed, the side panel 50 pulled out, the module 88 pulled out, and the motor 62 or blower module 88 is replaced. If the evaporator blower motor 66 fails, the latches 96 are operated and the entire evaporator blower module 102 is pulled out for replacement of the evaporator motor 66 blower or module 102. Essentially the same removal procedures are utilized for cleaning of the blowers 60, 64.

The conditioner 10 is easily adapted to quite a variety of enclosures 12 and heat loads 18. A single conditioner 10 can do many different things with excellent performance and thermal and energy efficiency at all of these tasks. Dedicated individual industrial air conditioners are no longer needed. Excellent separation of the different temperature air flows is maintained by the conditioner 10 and the different temperatures are well separated.

The conditioner 10 of this invention can be mounted at any vertical location within the height of the enclosure 12 and can also be mounted on center or off to one side. The cooled air outlets 30, 32, 34, 36 can be selectively opened or closed and the doors 38 can be opened or closed or aimed up or down selectively to optimally focus the cooled air flow upon the heat load 18. If the heat load 18 is in two or more portions, the conditioner 10 could even be mounted between the portions of the heat load 18. The conditioner 10 can be effectively installed in any depth of enclosure 12, with the outlet end 44 being spaced inwardly of the enclosure 12, and the adjustable length ducts 146 being used to convey the hot waste air to and through the walls of the enclosure 12 can be adjusted to span the gap rearward of the outlet end 44.

Many other advantages, features and additional objects of the present invention will become manifest to those versed in the art upon making reference to the detailed description and accompanying drawings in which the preferred embodiment incorporating the principles of the present invention is set forth and shown by way of illustrative example.

Although other advantages may be found and realized and various modifications may be suggested by those versed in the art, be it understood that we embody, within the scope of the patent warranted hereon, all such embodiments as reasonably and properly come within the scope of our contribution to the art.

We claim as our invention:

1. An industrial electronics air conditioner, comprising:
   a) a conditioner cabinet;
   b) an electromechanical refrigeration system within said cabinet, said system having a compressor, a condenser, an evaporator, a condenser blower and motor, and an evaporator blower and motor;
   c) an ambient air inlet to the condenser and a heated air outlet from the condenser;
   d) a heat load air inlet through the cabinet to the evaporator and a cooled air plenum downstream of the evaporator;
   e) spaced apart cooled air outlets through said cabinet from said plenum, said outlets facing up, down, and transversely; and
   f) means in said outlets for selectively directing a cooled air flow outward of said cabinet in upward, downward, or transverse directions.

2. The air conditioner of claim 1, in which said outlets define a single flat plane, said evaporator blower and motor being in said plenum, said cabinet having means for installation and/or removal of said evaporator blower and motor along an axis normal to said outlet plane.

3. The air conditioner of claim 1, in which said plenum and said outlets are all in a single end of said conditioner.

4. The air conditioner of claim 1, in which said outlets are one each on a top, a bottom, and on two opposed transverse sides of the cabinet.

5. The air conditioner of claim 1, in which at least one of said outlets is a side outlet, and including a door mounted in said side outlet, and means for mounting said door in either an upward facing or downward facing direction.

6. The air conditioner of claim 1, in which at least one of said outlets is selectively closed.

7. The air conditioner of claim 1 including at least one condenser hot air outlet extending between two of said spaced apart cooled air outlets.

8. The air conditioner of claim 1, in which said cooled air outlets are in a generally cross-shape configuration with said plenum being a central hub of the cross-shape.

9. The air conditioner of claim 8, in which said evaporator blower is a centrifugal blower wheel in said plenum, said wheel being rotatable on a longitudinal generally horizontal axis.

10. An industrial electronics air conditioner comprising:
    a) a conditioner cabinet having a top panel, a bottom panel, two side panels, at least one of said side panels being openable with respect to the remainder of the cabinet;
    b) an electromechanical refrigeration system within the cabinet, said system having a compressor, a condenser, and evaporator, a condenser blower and motor, and an evaporator blower and motor; and
    c) a transversely elongate condenser blower mount, said condenser blower and motor being secured to said mount, said mount and condenser blower and motor being transversely removable as a module from said cabinet when said one side panel is opened.

11. The air conditioner of claim 10, in which said blower is a pair of transversely spaced apart blowers, each of said blowers having an air outlet aimed at respective one of a pair of hot air outlets.

12. The air conditioner of claim 11, including a hot air plenum between said blowers and said hot air outlets.

13. The air conditioner of claim 12, in which said hot air plenum is closed by said condenser blower mount.

14. The air conditioner of claim 10, in which said mount is fastened and held in place by said two side panels, said mount being gasketed to said bottom panel and to an internal divider barrier between evaporator and condenser sides of the conditioner.

15. An industrial electronics air conditioner, comprising:
    a) a conditioner cabinet;
    b) an electromechanical refrigeration system having a compressor, a condenser, and an evaporator;

c) a suction type condenser blower module having a motor and a pair of spaced apart centrifugal blowers;
d) a pair of spaced apart condenser hot air outlets, said outlets being generally aligned with said blowers;
e) an evaporator blower and motor; and
f) a cooled evaporator air outlet extending in between said hot air outlets.

16. The air conditioner of claim 15, in which said hot air outlets are on lower bottom corners of an end of said conditioner.

17. The air conditioner of claim 15, in which said hot air outlets and said cooled air outlet are normal to each other.

18. The air conditioner of claim 15, including a hot air plenum between said blowers and said cooled air outlet.

19. The air conditioner of claim 15, including a transverse cooled evaporator air outlet above each hot air outlet.

20. An industrial electronics air conditioner, comprising:
a) a conditioner cabinet having generally flat exterior panels;
b) an electromechanical refrigeration system within said cabinet for cooling air;
c) a cooled air outlet plenum immediately inside of a one of said cabinet panels, said plenum having an internal cooled air inlet and being open to the outside of said cabinet through said one panel;
d) a plurality of spaced apart cooled air outlets extending from said outlet plenum;
e) an electrical connector socket in either said plenum or said cooled air outlet; and
f) a cooled air blower module having
  1) a plenum cover sized to close said plenum,
  2) a centrifugal blower wheel mounted to an electric motor, said motor being mounted to an inside of said cover,
  3) an electrical connector plug extending from said motor,
  4) means in said cover and said cabinet for positionally locating said covers over said plenum, and
  5) manually operable latches in said cover and accessible from the outside of the cabinet, for securing and/or releasing of the blower module to and/or from the remainder of the air conditioner.

21. The air conditioner of claim 20, in which said cooled air outlets extend radially out of said cabinet from said blower wheel.

22. The air conditioner of claim 20, including hot air outlets extending out of said cabinet past said blower wheel and past said cooled air outlet.

23. The air conditioner of claim 22, in which said cooled air blower module is above and in between said hot air outlets.

24. The air conditioner of claim 20, including a cooled air suction plenum upstream of said blower wheel, and a barrier panel between said suction plenum and said blower wheel, said barrier panel also forming at least a portion of at least one of said cooled air outlets.

25. An industrial electronics air conditioner, comprising:
a) a conditioner cabinet having a top panel, a bottom panel, two side panels, and two end panels;
b) an electromechanical refrigeration system within the cabinet, said system having a compressor, a condenser, an evaporator, a condenser blower and motor, and an evaporator blower and motor;
c) an ambient air inlet through one of said end panels to said condenser;
d) a load air inlet through the cabinet to the evaporator coil and at least one cooled air outlet through the cabinet from the evaporator coil;
e) at least one hot air outlet through the cabinet from the condenser coil; and
f) an elongate exhaust duct fluid tightly slip-fitted inside of and to said hot air outlet and extendable from said conditioner cabinet to an outlet end remotely located from said cabinet.

26. The air conditioner of claim 25, in which an inside said hot air outlet is lined with thermal insulation.

27. The air conditioner of claim 25, in which said exhaust duct is corrugated plastic board having an inner layer, an outer layer, and a corrugation between the layers.

28. The air conditioner of claim 25, including a second said hot air outlet and a second said exhaust duct, said exhaust ducts being in corners of the conditioner.

29. The air conditioner of claim 28, in which said cooled air outlet is between said exhaust ducts.

30. An industrial electronics air conditioner, comprising:
a) a conditioner cabinet having a top panel, a bottom panel, two side panels, and two end panels;
b) an electromechanical refrigeration system within the cabinet, said system having a compressor, a condenser, an evaporator, a condenser blower and motor, and an evaporator blower and motor;
c) an ambient air inlet through one end panel, for the drawing of ambient air into the cabinet and to the condenser;
d) a load air inlet in or adjacent to the cabinet top panel;
e) a first barrier within the cabinet, said first barrier extending both fore and aft between the end panels and up and down between the top and bottom panels, said barrier dividing off the load air inlet, the evaporator and the evaporator blower in a cooling zone which is fluidly separate from a heat zone having the compressor, the condenser and the condenser blower therein;
f) a second barrier within the cabinet, said second barrier dividing the heat zone into a suction chamber and an outlet plenum;
g) a third barrier within the cabinet, said third barrier being generally upright and dividing the cooling zone into a suction chamber and an outlet plenum;
h) a heated ambient air outlet extending from said heat zone outlet plenum;
i) a cooled load air outlet extending from said cooling zone outlet plenum; and in which
j) said first and third barriers, and said ambient and load air outlets, each cross past each other.

31. The air conditioner of claim 30, in which said third barrier crosses through said first barrier.

32. The air conditioner of claim 31, in which said third barrier divides said hot air plenum into two hot ambient air outlets.

33. The air conditioner of claim 32, in which a cooled load air outlet extends between said two hot ambient air outlets.

34. The air conditioner of claim 30, in which said evaporator is above said condenser blower and motor and above said heat zone outlet plenum, and in which said evaporator blower and motor is above said heated ambient air outlet.

35. The air conditioner of claim 34, wherein said evaporator blower is a centrifugal blower wheel rotatable about a generally horizontal axis.

36. An air conditioned electronic control center comprising:
   a) an electronics enclosure having first and second opposed sidewalls which are spaced from each other.
   b) a heat producing electrical structure within said enclosure;
   c) an industrial electromechanical air conditioner mounted within said enclosure; said conditioner having means for moving and cooling air within the enclosure;
   d) an air inlet aperture through said first sidewall of said enclosure for admission of ambient air into the conditioner; and
   e) an elongate exhaust duct extending out of said conditioner and through said second sidewall of said enclosure, for discharge of heated ambient air to the outside of the enclosure on an opposite side from said air inlet.

37. The electronic control center of claim 36, in which said exhaust duct is corrugated plastic board having inner and outer layers separated by a corrugation layer.

38. The electronic control center of claim 36, in which said air conditioner has a load air inlet which faces upward, and a cooled load air outlet which faces downward, said exhaust duct at a level between said load air inlet and said downward facing load air outlet.

39. A method of installing an air conditioner into an electronics enclosure, comprising the steps of:
   a) providing a first aperture through the enclosure for flow of ambient air to the conditioner;
   b) providing at least one second aperture through the enclosure for a hot air exhaust duct;
   c) installing the air conditioner inside of the enclosure with an air conditioner ambient air inlet being in fluid communication with ambient through the first aperture;
   d) extending a corrugated plastic board exhaust duct through the second aperture and into registry with a condenser hot air outlet in the air conditioner;
   e) sealing the exhaust duct to the outlet; and
   f) trimming the exhaust duct to an appropriate length which projects outward past the second aperture to outside of the enclosure.

40. The method of claim 39, including the step of pushing the duct into the hot air outlet.

41. The method of claim 39, including the step of extending a second duct parallel to the first duct, from a second hot air outlet to a further second aperture, and providing a downwardly directed cooled air flow in between the said ducts.

42. The method of claim 39, including the step of spacing said conditioner inward from said enclosure second aperture.

43. The method of claim 39 including the further steps of providing a plurality of cooled air outlets in said conditioner and directing said cooled air outlets in downward and transverse directions, and selectively opening and/or closing one or more of said cooled air outlets and thereby focusing cooled air flow upon a heat load within the enclosure.

44. The method of claim 43, including the further step of deflecting cooled air in a transverse direction either upward or downward with a side air director door.

45. The air conditioner of claim 1 including a pair of condenser hot air outlets straddling one of said cooled air outlets.

46. The electronic control center of claim 36, in which said air conditioner has cooled load air outlets which face downward, upward and sideways, said exhaust duct extending generally horizontally from said conditioner to an exit aperture in said second sidewall, said exit aperture being spaced from said conditioner.

* * * * *